(12) United States Patent
Tischler et al.

(10) Patent No.: US 10,355,176 B2
(45) Date of Patent: *Jul. 16, 2019

(54) FORMATION OF UNIFORM PHOSPHOR REGIONS FOR BROAD-AREA LIGHTING SYSTEMS

(71) Applicant: EPISTAR CORPORATION, Hsinchu (TW)

(72) Inventors: Michael A. Tischler, Vancouver (CA); Calvin W. Sheen, Chula Vista, CA (US)

(73) Assignee: EPISTAR CORPORATION, Hsinchu (TW)

( * ) Notice: Subject to any disclaimer, the term of this patent is extended or adjusted under 35 U.S.C. 154(b) by 467 days.

This patent is subject to a terminal disclaimer.

(21) Appl. No.: 15/140,042

(22) Filed: Apr. 27, 2016

(65) Prior Publication Data

US 2016/0240749 A1    Aug. 18, 2016

Related U.S. Application Data

(63) Continuation of application No. 14/454,258, filed on Aug. 7, 2014, now abandoned, which is a continuation of application No. 13/684,806, filed on Nov. 26, 2012, now Pat. No. 8,828,759.

(60) Provisional application No. 61/567,302, filed on Dec. 6, 2011, provisional application No. 61/589,908, filed on Jan. 24, 2012.

(51) Int. Cl.
| | |
|---|---|
| *H01L 33/50* | (2010.01) |
| *H05K 13/04* | (2006.01) |
| *B32B 37/24* | (2006.01) |
| *H01L 21/67* | (2006.01) |
| *H01L 33/00* | (2010.01) |

(52) U.S. Cl.
CPC ............ *H01L 33/504* (2013.01); *B32B 37/24* (2013.01); *H01L 21/67132* (2013.01); *H01L 33/005* (2013.01); *H01L 33/50* (2013.01); *H01L 33/505* (2013.01); *H01L 33/507* (2013.01); *H05K 13/046* (2013.01); *H01L 2933/0041* (2013.01); *Y10T 29/53174* (2015.01)

(58) Field of Classification Search
CPC ....... H01L 21/67132; H01L 2933/0041; H01L 33/50; H01L 33/504; H01L 33/505; H01L 33/507; H05K 13/046; Y10T 29/53174; Y10T 156/1734; Y10T 156/1741; B32B 37/24
USPC .................................................. 156/552, 555
See application file for complete search history.

(56) References Cited

U.S. PATENT DOCUMENTS 8,828,759 B2 * 9/2014 Tischler .................. H01L 33/50
438/27
2013/0140983 A1 * 6/2013 Ling ..................... H01L 33/508
313/512

FOREIGN PATENT DOCUMENTS

GB           1072075 A *   6/1967  ........... G03G 15/167

* cited by examiner

*Primary Examiner* — Philip C Tucker
*Assistant Examiner* — Jimmy R Smith, Jr.
(74) *Attorney, Agent, or Firm* — Patterson + Sheridan, LLP

(57) ABSTRACT

In accordance with certain embodiments, phosphor arrangements are formed via adhering phosphors to activated regions on a substrate and transferring them to a different substrate.

26 Claims, 9 Drawing Sheets

FORMATION OF UNIFORM PHOSPHOR REGIONS FOR BROAD-AREA LIGHTING SYSTEMS

RELATED APPLICATIONS

This application is a continuation of U.S. patent application Ser. No. 14/454,258, filed Aug. 7, 2014, which is a continuation of U.S. patent application Ser. No. 13/684,806, filed Nov. 26, 2012, which claims the benefit of and priority to U.S. Provisional Patent Application No. 61/567,302, filed Dec. 6, 2011, and U.S. Provisional Patent Application No. 61/589,908, filed Jan. 24, 2012, the entire disclosure of each of which is hereby incorporated herein by reference.

FIELD OF THE INVENTION

In various embodiments, the present invention generally relates to electronic devices, and more specifically to array-based electronic devices.

BACKGROUND

Light sources such as light-emitting diodes (LEDs) are an attractive alternative to incandescent and fluorescent light bulbs in illumination devices due to their higher efficiency, smaller form factor, longer lifetime, and enhanced mechanical robustness. However, the high cost of LEDs and associated heat-sinking and thermal-management systems have limited the widespread utilization of LEDs, particularly in broad-area general lighting applications.

The high cost of LED-based lighting systems has several contributors. LEDs are typically encased in a package, and multiple packaged LEDs are used in each lighting system to achieve the desired light intensity. In order to reduce costs, LED manufacturers have developed high-power LEDs that emit relatively higher light intensities by operating at higher currents. While reducing the package count, these LEDs require higher-cost packages to accommodate the higher current levels and to manage the significantly higher resulting heat levels. The higher heat loads and currents, in turn, typically require more expensive thermal-management and heat-sinking systems which also add to the cost (as well as to the size) of the system. Higher operating temperatures may also lead to shorter lifetimes and reduced reliability. Finally, LED efficacy typically decreases with increasing drive current, so operation of LEDs at higher currents generally results in a reduction in efficacy when compared to lower-current operation.

A further problem associated with using fewer high-power LEDs in broad-area lighting—for example, to replace fluorescent lighting systems—is that the light must be expanded from the relatively small area of the die (on the order of 1 mm$^2$) to emit over a relatively large area (on the order of 1 ft$^2$ or larger). Such expansion often results in decreased efficiency, reduced performance, and increased cost. For example, a light panel may be edge-lit and incorporate features that redirect or scatter light. However, it is often difficult to achieve uniform light intensity over the entire emitting area of such panels, with the intensity generally being higher at the edge(s) near the light sources. Also, the emission pattern from such devices is typically Lambertian, resulting in poor utilization of light and relatively high glare.

An alternate approach to producing broad-area lighting is to use a large array of small LEDs positioned over the desired emitting area. Such LEDs may be unpackaged LEDs (i.e., LED dies) or packaged within, e.g., a leadframe and polymeric encapsulation. This tends to reduce the cost and efficiency losses associated with optics required to spread out light from a small number of high-power LEDs. However, this approach typically involves forming an array of a very large number of light emitters over a relatively large area. In many such approaches the substrate upon which the light emitters are formed may be mated with other materials to aid in integration of phosphors, optics or for protection of the light-emitter sheet.

Lighting systems have a wide range of specifications, for example for luminous efficacy, light output power, color temperature, color rendering index (CRI) and the like. Many of these specifications are related to the LEDs, the light-conversion material (utilized to shift the wavelength of light from the LEDs to another wavelength, resulting in, e.g., white light), and the interaction between the two. In particular, various specifications in large measure determine the luminous efficacy, the color temperature, and the CRI. Uniformity of these characteristics is another key specification for lighting systems and the uniformity of the luminous efficacy, color temperature, and CRI are typically directly dependent on the homogeneity of the LED and light-conversion materials.

In array based lighting systems it can be difficult to achieve acceptable uniformity of the light-conversion material. Typically the phosphor powder is mixed in a binder, for example silicone, and this is applied or dispensed to the LEDs. The phosphor powder may segregate in the binder, resulting in a non-homogeneous distribution of phosphor in the binder associated with each LED. A second complication is that the binder may start to cure, even at room temperature, during the application process. Partial curing of the binder during the application process may result in non-uniform phosphor coverage.

These issues may apply to many types of phosphor-converted light emitters, including single-LED packaged devices, multiple-LED packaged devices, arrays of LED and single or arrays of unpackaged LED (die) to which phosphor is applied. In some systems it is desirable to integrate the LEDs and phosphor with one or more optical elements (e.g., a lens) to control the light-distribution pattern. Optical alignment of the LED and phosphor with the optical element(s) is often important to achieve the desired light-distribution pattern and high optical efficiency.

In view of the foregoing, a need exists for the uniform and low-cost application of phosphors to LEDs, and in particular either selectively or with full coverage over arrays of LEDs, as well as for economical, reliable LED-based lighting systems based thereon. A need also exists for improvements in integration and alignment of optical elements with LEDs and phosphors.

SUMMARY

In accordance with certain embodiments, multiple phosphor arrangements (i.e., portions with or without a predefined shape) are formed in parallel via the activation (i.e., alteration to attract phosphor particles) of particular regions on a first substrate, adherence of the phosphor (e.g., in powder form) to the activated regions, and transfer of the phosphor regions to a second substrate. The first substrate may be shaped in order to provide the adhered phosphors the predefined shape, and the phosphors may be partially or substantially completely cured (i.e., heated to agglomerate together alone or within a binder material) before or after transfer to the second substrate. The second substrate may incorporate light-emitting elements (LEEs) thereon that may be at least partially covered or encased by the phosphor arrangements. In this manner, large arrays of LEEs may be integrated with phosphors controllably, repeatably, and in parallel. The regions of the first substrate may be activated and deactivated via selective introduction and removal of an electric charge, which may be introduced via, e.g., application of electrical voltage and/or light. The formation of the phosphor arrangements may even be performed on large scales with a roll-to-roll process Herein, two components such as light-emitting elements, optical elements, phosphor portions, and/or other portions of lightsheets or optical substrates (e.g., holes or wells (i.e., depressions or other recessed regions)) being "aligned" or "associated" with each other may refer to such components being mechanically and/or optically aligned. By "mechanically aligned" is meant coaxial or situated along a parallel axis. By "optically aligned" is meant that at least some light (or other electromagnetic signal) emitted by or passing through one component passes through and/or is emitted by the other.

As utilized herein, an "optical substrate" is a material for receiving, manipulating, and/or transmitting light. An optical substrate may include or consist essentially of, e.g., a transparent or translucent sheet or plate, a waveguide and/or one or more (even an array of) optical elements such as lenses. For example, optical elements may include or consist essentially of refractive optics, reflective optics, Fresnel optics, total internal reflection optics, and the like. The optical substrate may include features or additional components or materials to scatter, reflect, or absorb light or a portion of light in the optical substrate, and it may confine light by total internal reflection prior to its emission from the optical substrate. An optical substrate comprising a plurality of optical elements is preferably a unitary substrate having the optical elements formed therein or thereon.

As utilized herein, the term "light-emitting element" (LEE) refers to any device that emits electromagnetic radiation within a wavelength regime of interest, for example, a visible, infrared or ultraviolet regime, when activated, by applying a potential difference across the device or passing a current through the device. Examples of light-emitting elements include solid-state, organic, polymer, phosphor-coated or high-flux LEDs (bare-die or packaged), microLEDs, laser diodes or other similar devices as would be readily understood. The emitted radiation of a LEE may be visible, such as red, blue or green, or invisible, such as infrared or ultraviolet, and may have a single wavelength or a spread of wavelengths. A LEE may feature a phosphorescent or fluorescent material for converting a portion of its emissions from one set of wavelengths to another. A LEE may include multiple constituent LEEs, each emitting at essentially the same or different wavelength(s). In some embodiments, a LEE is an LED that may feature a reflector over all or a portion of its surface upon which electrical contacts are positioned. The reflector may also be formed over all or a portion of the contacts themselves. In some embodiments, the contacts are themselves reflective.

A LEE may be of any size. In some embodiments, a LEEs has one lateral dimension less than 500 µm. Exemplary sizes of a LEE may include about 250 µm by about 600 µm, about 250 µm by about 400 µm, about 250 µm by about 300 µm, or about 225 µm by about 175 µm. In some embodiments, a LEE includes or consists essentially of a small LED die, also referred to as a "microLED." A microLED generally has one lateral dimension less than about 300 µm. In some embodiments, the LEE has one lateral dimension less than about 200 µm or even less than about 100 µm. For example, a microLED may have a size of about 225 µm by about 175 µm or about 150 µm by about 100 µm or about 150 µm by about 50 µm. In some embodiments, the surface area of the top surface of a microLED is less than 50,000 µm$^2$ or less than 10,000 µm$^2$. However, the size and/or shape of the LEE is not a limitation of the present invention.

As used herein, "phosphor" refers to any material that shifts the wavelengths of light irradiating it and/or that is luminescent, fluorescent, and/or phosphorescent, and is utilized interchangeably with the term "light-conversion material." As used herein, a "phosphor" may refer to only the photoactive powder or particles or to the powder or particles within a polymeric binder. The specific components and/or formulation of the phosphor and/or binder material are conventional and not limitations of the present invention. The binder may also be referred to as an encapsulant or a matrix material.

In an aspect, embodiments of the invention feature a method of forming an arrangement of phosphors. One or more regions of a first substrate are activated, whereby the one or more regions attract phosphor powder. Phosphor powder is introduced to the first substrate, the phosphor powder adhering to the one or more activated regions of the first substrate but not to other regions. The adhered phosphor powder is transferred to a second substrate different from the first substrate, thereby forming the arrangement of phosphors.

Embodiments of the invention may feature one or more of the following in any of a variety of combinations. The one or more regions of the first substrate may each be a portion of a non-photoconductive surface. The one or more regions of the first substrate may each be a portion of a photoconductive surface. Activating the one or more regions may include or consist essentially of (i) inducing an electrical charge on the entire photoconductive surface and (ii) illuminating portions of the photoconductive surface other than the one or more regions to diminish the charge on the illuminated portions. Activating the one or more regions may include or consist essentially of inducing an electrical charge thereon. The one or more regions of the first substrate may be conductive regions in or on the first substrate. An opposite electrical charge (i.e., a charge having a polarity opposite that of the electrical charge on the one or more regions) may be induced on the phosphor powder prior to adhering the phosphor powder to the one or more activated regions. Transferring the adhered phosphor powder to the second substrate may include or consist essentially of inducing an electrical charge on the second substrate. Transferring the adhered phosphor powder may include or consist essentially of at least partially removing the electrical charge from the one or more regions of the first substrate.

One or more light-emitting elements may be associated (e.g., aligned) with each phosphor such that at least a portion of light emitted by each light-emitting element is converted to a different wavelength by the associated phosphor. A transparent material may be disposed over at least one of the phosphors before associating the one or more light-emitting elements with each phosphor. Associating the one or more light-emitting elements with each phosphor may include or consist essentially of bonding to the second substrate a third substrate having the one or more light-emitting elements thereon, whereby each phosphor is aligned with one or more light-emitting elements. The adhered phosphor powder may be transferred to indented regions in the second substrate. Associating the one or more light-emitting elements with each phosphor may include or consist essentially of disposing one or more light-emitting elements in each indented region. The one or more activated regions of the first substrate may be indented, and the adhered phosphor powder may be transferred to one or more complementary structures on the second substrate. Each of the complementary structures may include one or more light-emitting elements therein. The phosphor powder may include or consist essentially of phosphor particles and a binder. The binder may be heated to fix the phosphor powder in place after transfer to the second substrate. The activating, introducing, and transferring steps may each be performed as part of a roll-to-roll process.

In another aspect, embodiments of the invention feature a roll-to-roll apparatus for fabricating phosphor arrangements that includes or consists essentially of a first roll for supplying a continuous length of a flexible substrate material, a second roll for accepting the continuous length of flexible substrate material from the first roll, a die-attach tool, a rotatable drum having a photoconductive surface, a first dispenser for dispensing phosphor powder over the photoconductive surface, and an illuminator. The die-attach tool attaches light-emitting elements to the flexible substrate material as the flexible substrate material travels from the first roll to the second roll. The rotatable drum is configured to dispose portions of phosphor over the flexible substrate material as the flexible substrate material travels from the first roll to the second roll. The first dispenser is disposed over at least a portion of the drum. The illuminator selectively illuminates portions of the photoconductive surface as the drum rotates to render the illuminated portions attractive to the dispensed phosphor powder. The second roll accepts flexible substrate material having light-emitting elements each with a phosphor portion disposed thereover. The apparatus may include, disposed between the die-attach tool and the drum, a second dispenser for dispensing a binder material over the light-emitting elements after attachment thereof to the flexible substrate material. The apparatus may include a scanning system for scanning light from the illuminator over the photoconductive surface.

In yet another aspect, embodiments of the invention feature a roll-to-roll apparatus for fabricating phosphor arrangements that includes or consists essentially of a first roll for supplying a continuous length of a flexible substrate material, a second roll for accepting the continuous length of flexible substrate material from the first roll, a third roll for supplying a continuous length of a second substrate material, a die-attach tool, a rotatable drum having a photoconductive surface, a first dispenser for dispensing phosphor powder over the photoconductive surface, an illuminator, and an arrangement of rollers. The die-attach tool attaches light-emitting elements to the second substrate material after the second substrate material is supplied by the third roll. The rotatable drum is configured to dispose portions of phosphor over the flexible substrate material as the flexible substrate material travels from the first roll to the second roll. The first dispenser is disposed over at least a portion of the drum. The illuminator selectively illuminates portions of the photoconductive surface as the drum rotates to render the illuminated portions attractive to the dispensed phosphor powder. The arrangement of rollers is configured to bring the second substrate material and the flexible substrate material in proximity at a joining location after (i) light-emitting elements have been attached to the second substrate material and (ii) phosphor portions have been disposed over the flexible substrate material, thereby enabling transfer of the light-emitting elements to the phosphor portions over the flexible substrate material. The second roll accepts flexible substrate material having light-emitting elements each with a phosphor portion disposed thereover. The apparatus may include, disposed between the drum and the joining location, a second dispenser for dispensing a binder material over the phosphor portions after disposal thereof over the flexible substrate material. The apparatus may include a scanning system for scanning light from the illuminator over the photoconductive surface.

These and other objects, along with advantages and features of the invention, will become more apparent through reference to the following description, the accompanying drawings, and the claims. Furthermore, it is to be understood that the features of the various embodiments described herein are not mutually exclusive and can exist in various combinations and permutations. Reference throughout this specification to "one example," "an example," "one embodiment," or "an embodiment" means that a particular feature, structure, or characteristic described in connection with the example is included in at least one example of the present technology. Thus, the occurrences of the phrases "in one example," "in an example," "one embodiment," or "an embodiment" in various places throughout this specification are not necessarily all referring to the same example. Furthermore, the particular features, structures, routines, steps, or characteristics may be combined in any suitable manner in one or more examples of the technology. As used herein, the term "substantially" means ±10%, and in some embodiments, ±5%. The term "consists essentially of" means excluding other materials that contribute to function, unless otherwise defined herein. Nonetheless, such other materials may be present, collectively or individually, in trace amounts.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Figure 1:
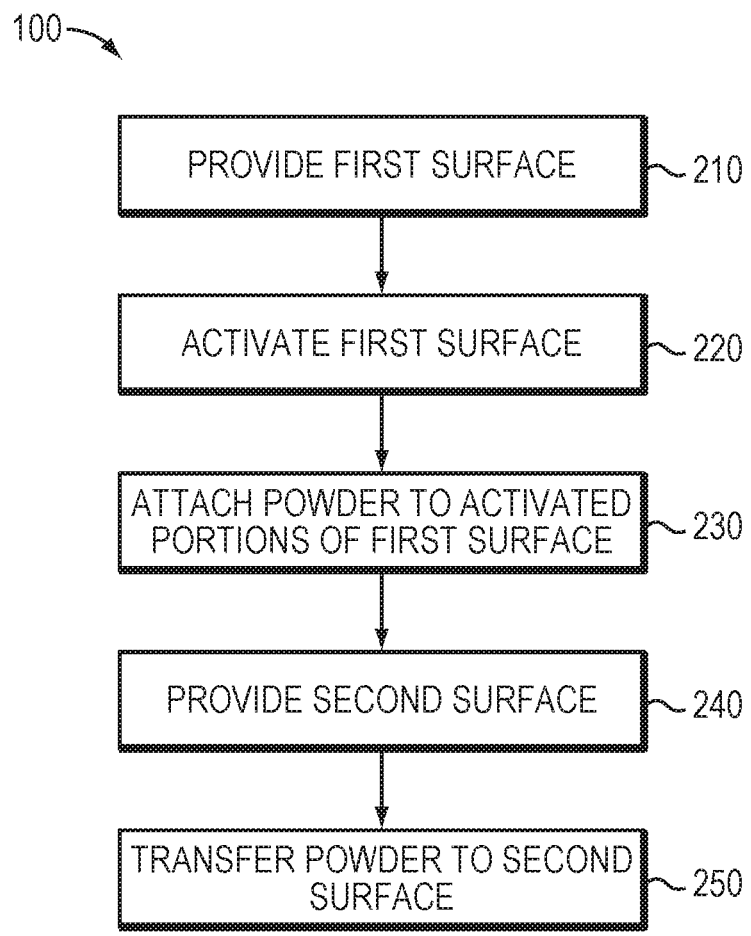
FIGS. 1 and 2 are flow charts depicting fabrication processes in accordance with various embodiments of the present invention.

FIG. 1 is a flow chart depicting a process 100 in accordance with an embodiment of the present invention. Process 100 is shown as having five steps, but this is not a limitation of the present invention and in other embodiments the invention has more or fewer steps and/or the steps may be performed in a different order. Process 100 begins with step 210 in which a first surface is provided. In step 220 a portion or substantially all of the first surface is activated, i.e., treated to attract a powder (e.g., a phosphor powder) to the activated areas; in other words, an activated area is one that attracts a phosphor powder and, when deactivated, does not exert this attraction. In step 230 one or more powders are attached to the activated portions of the first surface. In step 240 a second surface is provided (the second surface may also be referred to as a target surface), and in step 250 one or more portions or substantially all of the powder(s) are transferred to the second surface.

Figure 2:
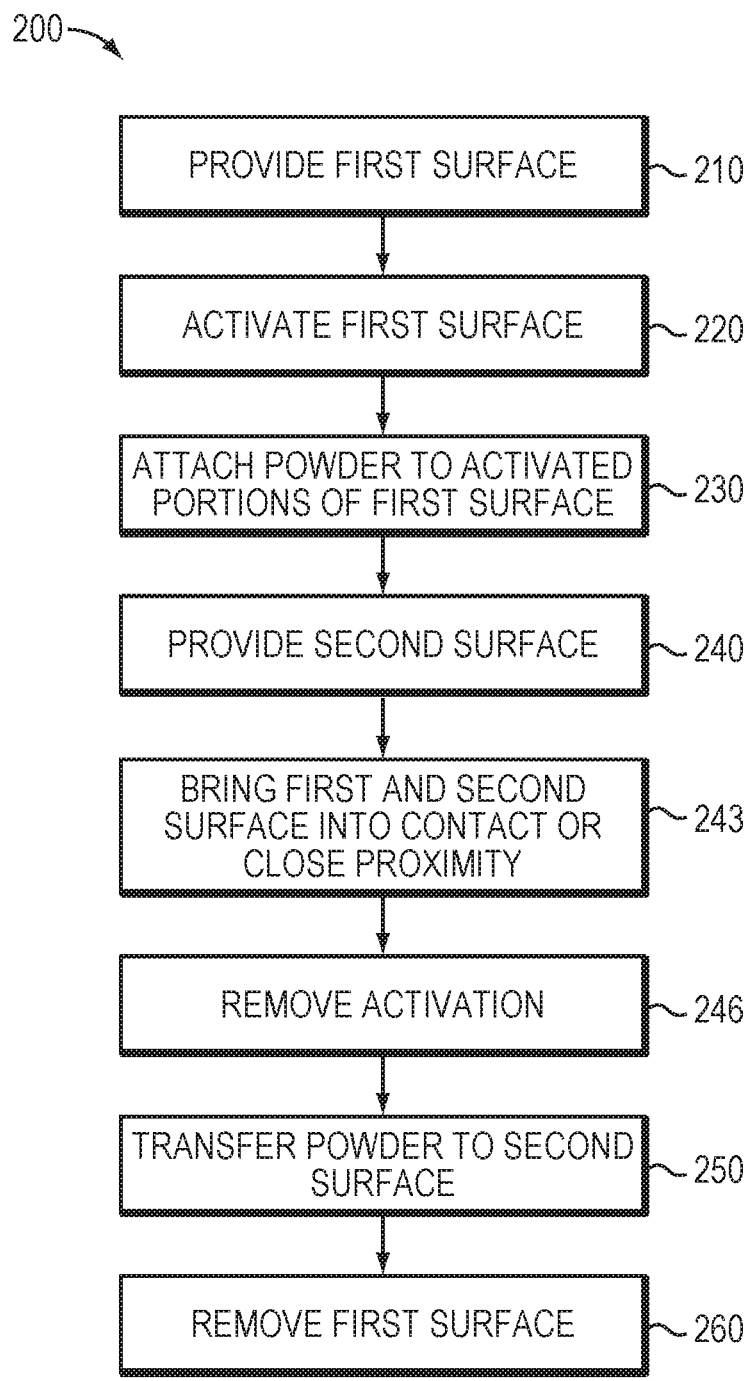

As mentioned above, embodiments of the present invention may include additional steps. FIG. 2 is a flow chart depicting a process 200 featuring three additional optional steps. In optional step 243 the first surface having the powder(s) attached thereto is brought into proximity or contact with the second surface. In optional step 246 the activation is reduced or removed after the surfaces are brought into proximity or contact in order to reduce or eliminate the attractive force attaching the powder to the first surface. In optional step 260 the first surface is removed from the second surface.

Figure 3:
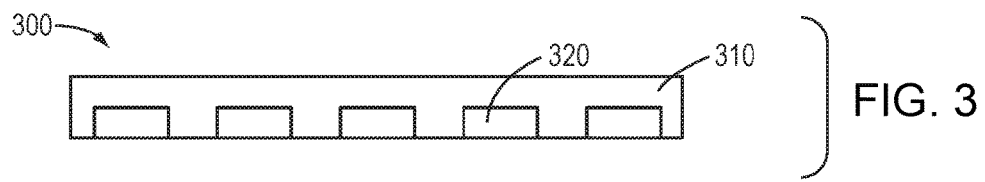
FIGS. 3, 4A, and 4B are cross-sectional schematics illustrating steps of fabrication processes for phosphor arrangements in accordance with various embodiments of the present invention.

In various embodiments of the present invention, the first surface referred to in FIGS. 1 and 2 is an insulating surface into or onto which conductive regions have been formed, as shown in FIG. 3. FIG. 3 depicts a structure 300 including or consisting essentially of an insulating substrate 310 and conductive regions 320 in a surface thereof, corresponding to step 210 in FIG. 1. As per step 220 of FIG. 1, the conductive regions 320 are activated by, e.g., placing a charge, for example a static electrical charge, on the conductive regions 320. In some embodiments the charge is a positive charge while in other embodiments the charge is a negative charge.

Insulating substrate 310 may include or consist essentially of, for example, acrylic, polycarbonate, polyethylene naphthalate (PEN), polyethylene terephthalate (PET), polycarbonate, polyethersulfone, polyester, polyimide, polyethylene, glass, Teflon or the like. Each conductive region 320 may include or consist essentially of a metal, for example gold, silver, aluminum, or the like, carbon, a conductive oxide, or any other electrically conductive material, or any material capable of holding an electrical or static electrical charge. Conductive region 320 may be formed over insulating substrate 310, for example using physical vapor deposition, chemical vapor deposition, sputtering, etc. or may be pre-formed and attached to insulating substrate 310 or partially inserted into wells (or other depressions) in insulating substrate 310. The material and method of formation of conductive region 320 is not a limitation of the present invention. In some embodiments conductive regions 320 are covered or partially covered by an insulating layer (not shown in FIG. 3). Substrate 310 may be non-photoconductive.

Figure 4A:
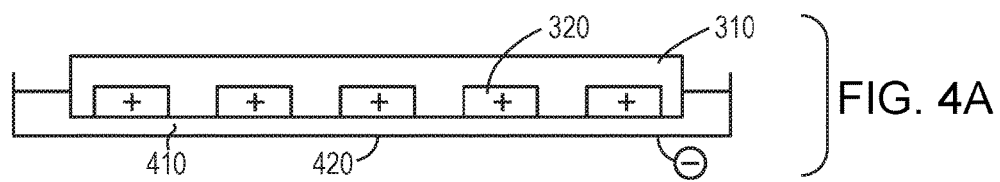
Figure 4B:
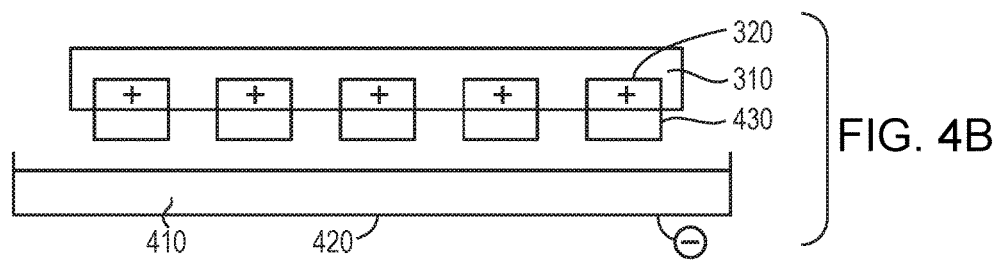

As described above in step 230, one or more powders are attached to regions 320 after regions 320 are activated. In some embodiments this is accomplished by charging the powder(s) with the opposite charge of that placed on conductive regions 320 in step 220. The oppositely charged powders or particles will thus be attracted to charged conductive regions 320 and adhere to them. FIGS. 4A and 4B depict one such embodiment of the present invention. FIG. 4A depicts system 300 in which a positive charge has been placed on the conductive regions 320. Then, system 300 is partially or completely immersed in a powder 410 having a negative charge. As shown in FIG. 4B, after removal of system 300 from powder 410, portions 430 of powder 410 are attached to the conductive regions 320. Powder 410 is shown in FIGS. 4A and 4B as contained in a tray 420; however, this is not a limitation of the present invention and in other embodiments powder 410 is contained and/or applied to system 300 in any of a variety of different ways. For example, in other embodiments powder 410 is applied using a roller, by spraying, pouring, or shaking the powder on the surface of the insulating substrate 310 into or onto which the conductive regions 320 have been formed. FIGS. 4A and 4B depict conductive regions 320 having a positive charge and powder 410 having a negative charge, but in other embodiments the polarities are reversed. In one embodiment powder 410 is a dry powder. In one embodiment powder 410 is mixed in a solution, for example isopropyl alcohol. In one embodiment the system shown in FIGS. 4A and 4B is configured for electrophoretic deposition.

Figure 5:
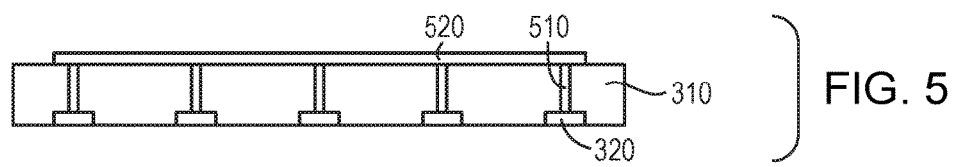
FIGS. 5 and 6 are cross-sectional schematics of substrates incorporating regions that may be activated to attract phosphors in accordance with various embodiments of the present invention.
Figure 6:
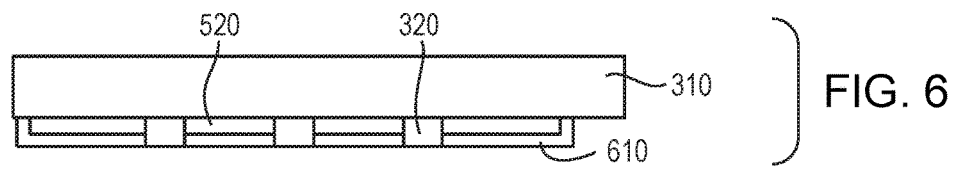

Conductive regions 320 may be electrically coupled together or they may be addressable. FIG. 5 shows one embodiment in which conductive regions 320 are electrically coupled by conductive elements 510 that connect conductive regions 320 to an electrical trace 520 on the opposite side of insulating substrate 310. FIG. 6 shows another embodiment in which conductive regions 320 are electrically coupled by electrical traces 520 that are at least partially covered by an insulating layer 610. While FIG. 5 shows only one electrical trace 520, this is not a limitation of the present invention and in other embodiments, multiple electrical traces 520 are utilized.

Figure 7:
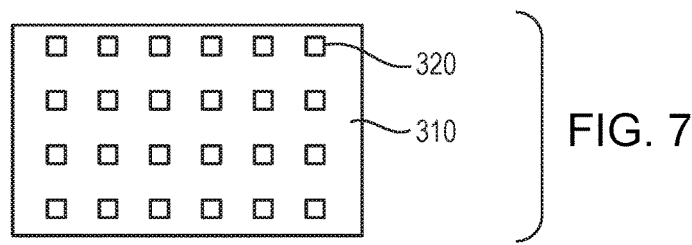
FIG. 7 is a plan view schematic of a substrate incorporating regions that may be activated to attract phosphors in accordance with various embodiments of the present invention.

FIG. 7 shows a plan view of the system 300 in accordance with various embodiments of the present invention. In FIG. 7 the conductive regions 320 are shown as having a square shape, but this is not a limitation of the present invention and in other embodiments conductive regions are circular, hexagonal, rectangular, oval, or have any arbitrary shape. FIG. 7 shows conductive regions 320 arranged in a regular periodic square array, but this is not a limitation of the present invention and in other embodiments conductive regions 320 are arranged in other patterns, for example rectangular, triangular, hexagonal, or any other array, or are laid out in an arbitrary pattern.

Figure 8A:
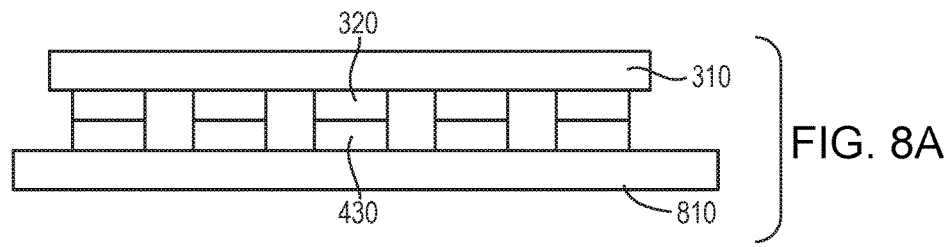
FIGS. 8A and 8B are cross-sectional schematics illustrating steps of fabrication processes for phosphor arrangements in accordance with various embodiments of the present invention.
Figure 8B:
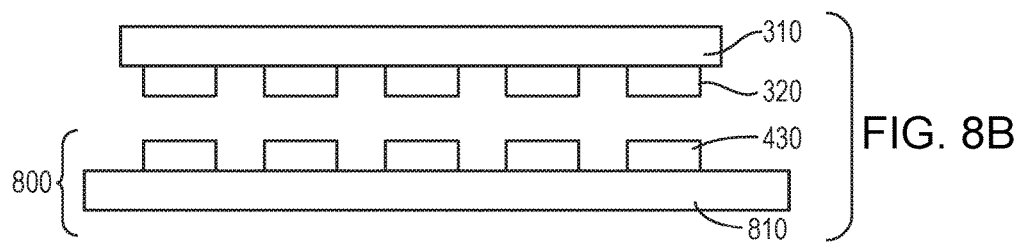

FIGS. 8A and 8B illustrate an exemplary embodiment of step 250 from FIG. 1 in which the powder portions 430 are transferred to a second or target substrate 810. FIG. 8A depicts the optional step 243 from FIG. 2, in which the insulating substrate 310 with powder 430 over conductive regions 320 is brought into contact with target substrate 810. FIG. 8B shows the structure of FIG. 8A at a later stage of manufacture, i.e., after step 250 of transferring powder 430 to target 810 and after optional step 260 of FIG. 2 in which insulating substrate 310 has been removed from target 810, forming a structure 800 that includes or consists essentially of the target substrate 810 with the powder portions 430 thereon.

In some embodiments the optional step 246 from FIG. 2 is performed to remove the activation from (or "deactivate") conductive regions 320 before step 250 of transferring powder 320 to target 810. In some embodiments removing the activation includes or consists essentially of reducing or eliminating the charge on conductive regions 320. In some embodiments removing the activation includes or consists essentially of changing the polarity of the charge on conductive regions 320. A charge with a polarity opposite the polarity of the charge on conductive regions 320 may be placed on all or portions of target 810 to facilitate transfer of powder 430 to target 810 and/or to facilitate adhesion of powder 430 to target 810. In some embodiments of the invention, after step 243 the polarity of the charge on conductive region 320 is reversed to facilitate transfer of powder 430 to target 810 and/or to facilitate adhesion of powder 430 to target 810. As further detailed below, the powder portions 430 may eventually be associated with LEEs in a lighting system to, e.g., wavelength convert at least a portion of the light emitted by the LEEs.

In some embodiments target 810 is substantially optically transparent or translucent. In some other embodiments target 810 is substantially opaque. For example, target 810 may exhibit a transmittance or reflectance greater than 70% for optical wavelengths ranging between approximately 400 nm and approximately 600 nm. Target 810 may include or consist essentially of a material that is transparent to a wavelength of light emitted by a LEE used in a lighting system (as described below) and/or phosphor 430. Target 810 may be substantially flexible or rigid. Target 810 may include or consist essentially of, for example, acrylic, polycarbonate, polyethylene naphthalate (PEN), polyethylene terephthalate (PET), polycarbonate, polyethersulfone, polyester, polyimide, polyethylene, glass, paper or the like. In some embodiments, target 810 includes or consists essentially of multiple materials and/or layers.

In some embodiments, the target 810 features one or more optical elements formed therein or thereon. In some embodiments, one optical element is associated with each LEE, while in other embodiments multiple LEEs are associated with one optical element, or multiple optical elements are associated with a single LEE, or no engineered optical element is associated with any LEE, for example a flat or roughened surface. In one embodiment target 810 includes elements or features to scatter, diffuse and/or spread out light generated by the LEE and/or phosphor 430. The optical elements may be formed by etching, polishing, grinding, machining, molding, embossing, extruding, casting, or the like. The method of formation of the optical elements is not a limitation of embodiments of the present invention.

In some embodiments target 810 includes multiple layers, e.g., a deformable layer over a rigid layer, for example, a semicrystalline or amorphous material, e.g., PEN, PET, polycarbonate, polyethersulfone, polyester, polyimide, polyethylene, polyurethane, and/or paper formed over a rigid substrate, for example one including acrylic, aluminum, steel, or the like. Target 810 may have an electrical resistivity greater than approximately 100 ohm-cm, greater than approximately $1 \times 10^6$ ohm-cm, or even greater than approximately $1 \times 10^{10}$ ohm-cm.

In preferred embodiments of the present invention, the process described above transfers a uniform, well-controlled layer of phosphor powder from a template (system 300) to a target (target substrate 810). Phosphor powder 430 may include or consist essentially of one or more separate distinct powders. In one embodiment, multiple powders 430 are applied in one cycle of the process. In other embodiments a plurality of cycles of the process are performed to, for example, form a thicker layer of powder on target 810 or apply two or more different powders in sequence.

Figure 9:
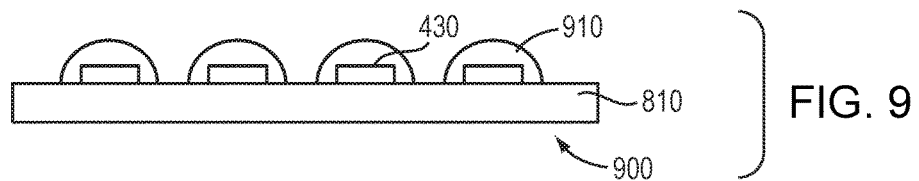
FIGS. 9-14 are cross-sectional schematics of substrates incorporating phosphor arrangements as well as regions of transparent material and/or light-emitting elements in accordance with various embodiments of the present invention.

In some embodiments powder 430 is "fixed" on target 810 by the application of an adhesive, epoxy or other similar material after application of powder 430. For example, in one embodiment a transparent epoxy 910 is applied over powder 430 as shown in FIG. 9. FIG. 9 depicts a structure 900 incorporating the powder regions 430 and a material 910 thereover. Material 910 may include or consist essentially of a transparent material, e.g., a matrix material, encapsulant, or binder. In one embodiment, transparent material 910 includes or consists essentially of silicone, epoxy or other suitable materials. Examples of transparent material 910 include materials from the ASP series of silicone phenyls manufactured by Shin Etsu, or the Sylgard series manufactured by Dow Corning. In FIG. 9 transparent material 910 is shown as having a substantially hemispherical shape, but this is not a limitation of the present invention and in other embodiments transparent material 910 has a rectangular, square, or any other shape.

Figure 10:
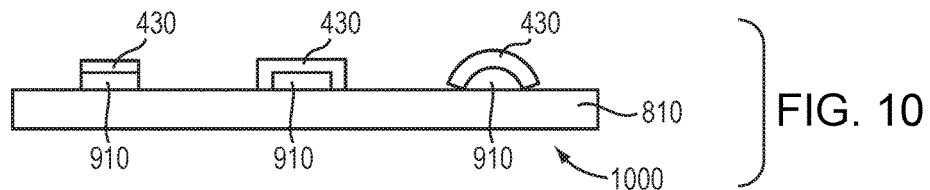

FIG. 10 depicts another embodiment of the invention in which a transparent material 910 is formed over target 810 before transfer of powder 430 from conductive regions 320, thereby forming a structure 1000. In FIG. 10, transparent material 910 is shown as having two different shapes, the leftmost two having a substantially rectangular shape and the rightmost having a substantially hemispherical shape. In these examples powder 430 is shown, as covering only the top of transparent material 910 (leftmost material 910) and covering substantially all of the exposed surfaces of transparent material 910 (center and rightmost material 910). The shape of transparent material 910 and the amount of coverage of powder 430 over transparent material 910 is not a limitation of the present invention and these may have different shapes and/or different coverage.

In some embodiments in which transparent material 910 is applied to target 810 prior to transfer of powder 430, the optional step 246 (i.e., removal of activation) is not necessary. In some embodiments in which transparent material 910 is applied to target 810 prior to transfer of powder 430, transparent material 910 is partially or substantially fully cured prior to the transfer of powder 430. In some embodiments in which transparent material 910 is applied to target 810 prior to transfer of powder 430, it may be advantageous for insulating substrate 310 to comprise a "non-stick" material such as Teflon, or to include a non-stick coating over the surface or portion of the surface that may come in contact with transparent material 910 so that transparent material 910 does not stick to insulating substrate 310 or conductive regions 320 during the transfer and separation process.

Figure 11:
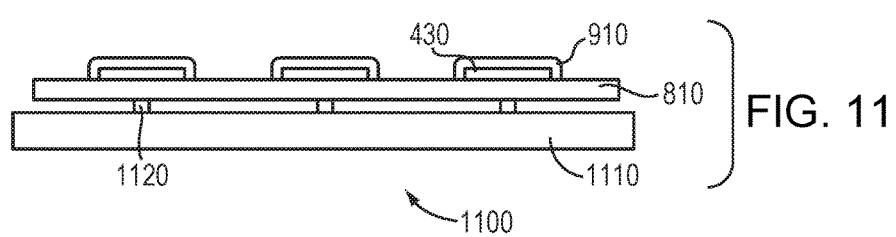

Any of the structures 800, 900, or 1000 may then be incorporated into a lighting system 1100 that includes one or more LEEs, as exemplarily shown in FIG. 11. The lighting system 1100, as shown, includes a LEE substrate 1110 and LEEs 1120 formed thereover. Target 810 is applied over substrate 1110 such that powder portions 430 in transparent material 910 are substantially aligned with LEEs 1120. In some embodiments a transparent material, for example a material identical or similar to transparent material 910, is placed between substrate 1110 and target 810 to enhance optical coupling. In some embodiments such a transparent material is placed between substrate 1110 and target 810 covering all or a portion of LEEs 1120 to reduce total-internal-reflection (TIR) losses in LEEs 1120, to improve light extraction, and/or to enhance optical coupling.

Figure 12:
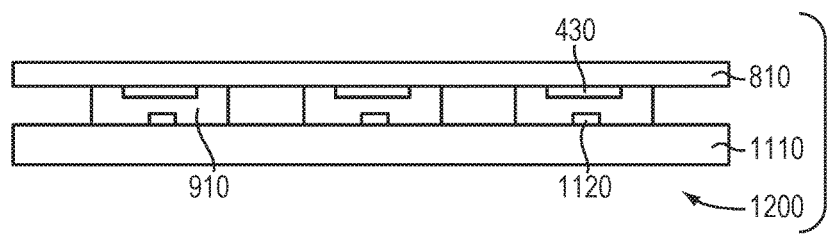

FIG. 12 shows a lighting system 1200 in accordance with various embodiments of the invention. In one embodiment, the lighting system 1200 incorporates structure 900 of FIG. 9. Structure 900 is applied to the substrate 1110 such that transparent material 910 is substantially aligned with LEEs 1120 and covers all or some LEEs 1120, as shown in FIG. 12. In some embodiments an additional transparent material 910 or a similar material may be applied to LEEs 1120 before mating with target 810. As shown in FIG. 12, powder 430 is spaced apart from LEEs 1120, thus providing a remote-phosphor configuration in which the phosphor (powder 430) is not in direct contact with the LEE 1120. This configuration may provide the advantage of the phosphor remaining cooler than if it were in direct contact with LEE 1120, and may reduce heat-induced efficiency degradation as well as provide longer lifetime. In other embodiments powder 430 is in contact or substantially in contact with LEE 1120.

Figure 13:
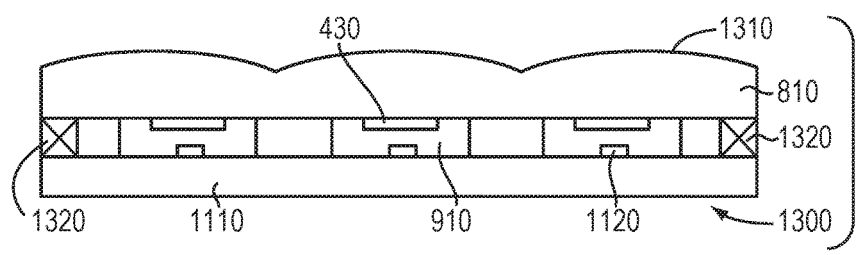

FIG. 13 depicts a lighting system 1300 in accordance with another embodiment of the invention. In this embodiment, the target 810 also forms an optic that provides a desired light-distribution pattern when incorporated into lighting system 1300. Target 810 includes or consists essentially of optical elements 1310, which in FIG. 13 are each substantially aligned with an LEE 1120. Target 810 typically features an array of optical elements 1310; in some embodiments, one optical element 1310 is associated with each LEE 1120, while in other embodiments multiple LEEs 1120 are associated with one optical element 1310, or multiple optical elements 1310 are associated with a single LEE 1120, or no engineered optical element is associated with any LEE 1120, for example portions of target 810 thereover may merely be flat or roughened surfaces. In one embodiment the optical elements 1310 scatter, diffuse and/or spread out light generated by LEE 1120.

Target 810 may be substantially optically transparent or translucent. For example, target 810 may exhibit a transmittance or reflectance greater than 70% for optical wavelengths ranging between approximately 400 nm and approximately 600 nm. Target substrate 810 may include or consist essentially of a material that is transparent to a wavelength of light emitted by LEE 1120 and/or powder/phosphor 430. Target 810 may be substantially flexible or rigid. In some embodiments, target 810 includes multiple materials and/or layers. Optical elements 1310 may be formed in or on target 810. For example, optical elements 1310 may be formed by etching, polishing, grinding, machining, molding, embossing, extruding, casting, or the like. The method of formation of optical elements 1310 is not a limitation of embodiments of the present invention.

Optical elements 1310 associated with target 810 may all be the same or may be different from each other. Optical elements 1310 may include or consist essentially of, e.g., a refractive optic, a diffractive optic, a TIR optic, a Fresnel optic, or the like, or combinations of different types of optical elements. Optical elements 1310 may be shaped or engineered to achieve a specific light-distribution pattern from the array of light emitters, phosphors and optical elements.

As in system 1200, in system 1300 transparent material 910 may reduce TIR losses in LEEs 1120 and may provide enhanced optical coupling between LEEs 1120 and powder/phosphor 430. FIG. 13 also shows an optional sealer 1320. Sealer 1320 seals the periphery of system 1300 from external influences, for example humidity, corrosive ambients, etc. Sealer 1320 may include or consist essentially of, for example, adhesive, glue, tape, or the material of target 810 and/or substrate 1110.

It should be noted that alignment, as used herein, may mean that the center of one structure, for example an LEE 1120, is aligned with the center of another structure, for example an optical element 1310; however, this is not a limitation of the present invention and in other embodiments alignment refers to a specified relationship between the geometries of multiple structures, as detailed above.

Figure 14:
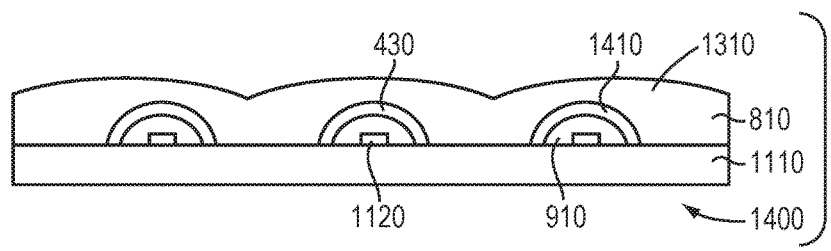
Figure 15:
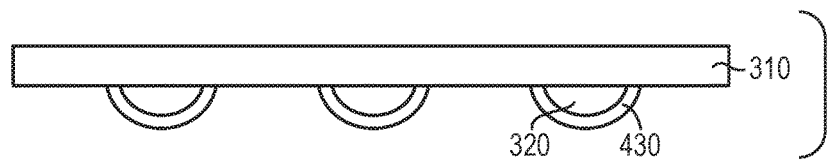
FIGS. 15 and 16 are cross-sectional schematics illustrating steps of fabrication of the structure of FIG. 14 in accordance with various embodiments of the present invention.
Figure 16:
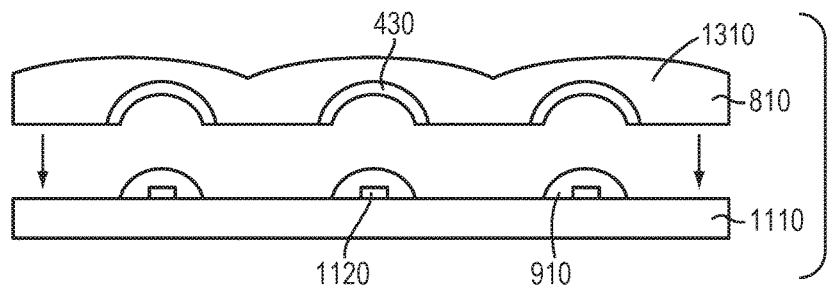

The illustrated embodiments of the invention feature a substantially flat target 810; however, this is not a limitation of the present invention. The method by which powder 430 is attached or attracted to conductive regions 320 is not dependent on conductive regions 320 and/or insulating substrate 310 being flat and/or smooth, and in other embodiments conductive regions 320 and/or insulating substrate 310 have arbitrary shapes. FIG. 14 depicts a system 1400 in accordance with one embodiment of the invention in which target 810 has one or more curved portions 1410. Such a target 810 may provide complete or substantially complete coverage of powder 430 over LEEs 1120 in a remote-phosphor configuration, and may also reduce or eliminate any gap between target 810 and substrate 1110. FIG. 15 shows an embodiment of insulating substrate 310 and conductive regions 320 that may be used to make the structure shown in FIG. 14. As described above, powder 430 is picked up on conductive regions 320, as shown in FIG. 15. Powder 430 is then transferred to target 810. Target 810 with powder 430 is then mated to a substrate 1110 having LEEs 1120 and transparent material 910, as shown in FIG. 16. In this case transparent material 910 is shown as being formed over all or a portion of each LEE 1120 prior to mating with target 810 and powder 430. In one embodiment powder 430 is transferred to transparent material 910, instead of target 810, before mating of target 810 with substrate 1110. Substrate 1110 may be affixed to target 810 by transparent material 910 or a similar material and/or by other means, for example adhesive, glue, tape, or the like. In one embodiment, double-sided tape, such as 3M 467MP, is used to affix substrate 1110 to target 810. In one embodiment a liquid adhesive, such as Dymax 3099, is used to affix substrate 1110 to target 810.

Figure 17:
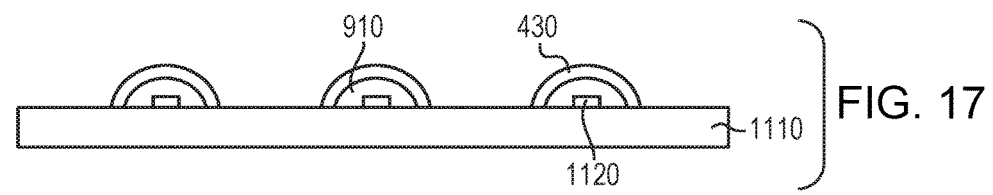
FIG. 17 is a cross-sectional schematic of a substrate incorporating phosphor arrangements as well as regions of transparent material and light-emitting elements in accordance with various embodiments of the present invention.
Figure 18:
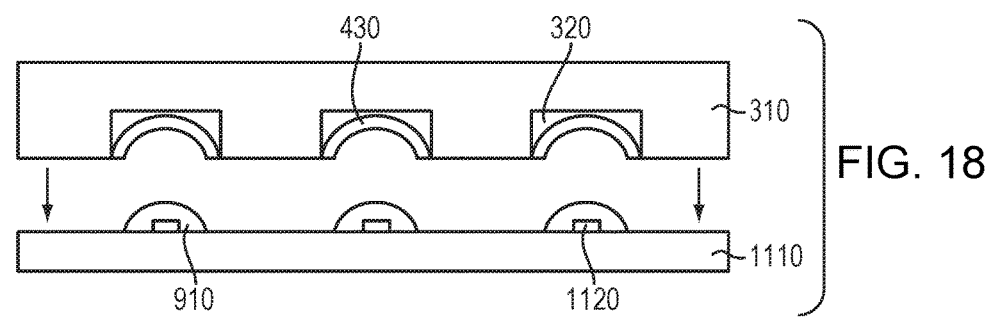
FIG. 18 is a cross-sectional schematic of a fabrication step utilized to form the structure of FIG. 17 in accordance with various embodiments of the present invention.

In some embodiments of the invention, target 810 includes one or more LEEs prior to powder/phosphor 430 being incorporated therewith. FIG. 17 depicts a system 1700 in accordance with various embodiments of the invention. As shown, system 1700 includes substrate 1110 having one or more LEEs 1120 formed thereover. A transparent material 910 and a powder 430 are formed over the LEEs 1120. FIG. 18 shows the structure of FIG. 17 at an early stage of manufacture. FIG. 18 shows an insulating substrate 310 having conductive regions 320, one or more of which has a concave shape. (As utilized herein, a "concave" shape is one that extends inward, thus forming a cavity or depression, but is not necessarily smooth or rounded, e.g., corresponding to a portion of a sphere or ellipse, and may also be designated an "indented" shape. And, a shape "complementary" to an indented shape has a shape "mirroring" the indented shape such that the two shapes fit together. For example, a complementary shape to a concave shape may be convex.) Powder 430 is attached to the concave-shaped conductive regions 320 and then mated with the transparent material 910 over the LEEs 1120 on substrate 1110, which preferably have a complementary shape. After mating of substrates 310, 1110, transfer of powder 430, and removal of insulating substrate 310 and conductive regions 320, the structure of FIG. 17 is produced. Transparent material 910 may then be fully or partially cured. In another embodiment, the transparent material 910 is formed into the concave regions of conductive material 320 over powder 430 prior to mating with substrate 1110.

Figure 19:
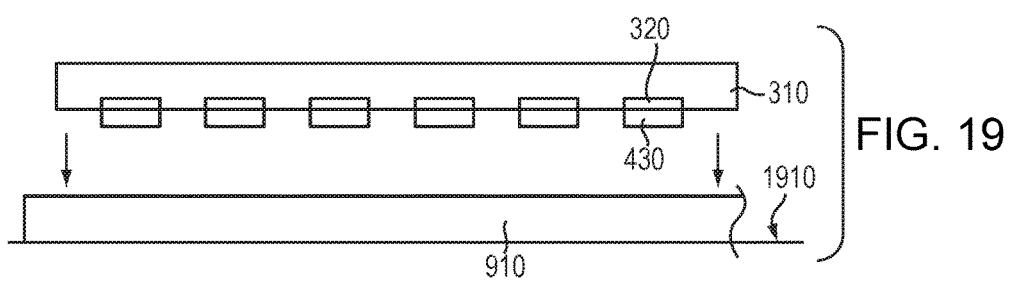
FIGS. 19-21 are cross-sectional schematics of illustrating steps of fabrication processes for phosphor arrangements in accordance with various embodiments of the present invention.
Figure 20:
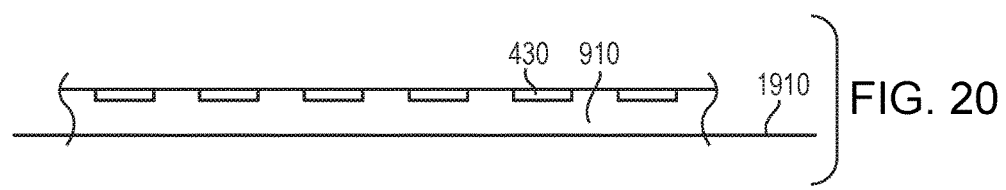

The same powder-deposition technique may be used to produce phosphor units that may then be subsequently applied to LEEs, for example using a pick-and-place tool. FIG. 19 shows one embodiment of such an approach, in which a transparent material 910 is formed over a surface 1910. The transparent material 910 may be cast into a mold or spread on the surface or formed by other techniques. Powder 430 (attached to conductive regions 320) is mated with transparent material 910, and powder 430 is transferred to transparent material 910 as shown in FIG. 20. Transparent material 910 may be partially cured prior to powder transfer. After transfer of powder 430, the transparent material 910 may be cured. In one embodiment, transparent material 910 with powder 430, as shown in FIG. 20, may be mated with multiple LEEs, where each powder portion 430 is substantially aligned with a LEE. In one embodiment, transparent material 910 is divided into sections, each of which including one or more powder portions 430, and each section may be mated with one or more LEEs.

Figure 21:
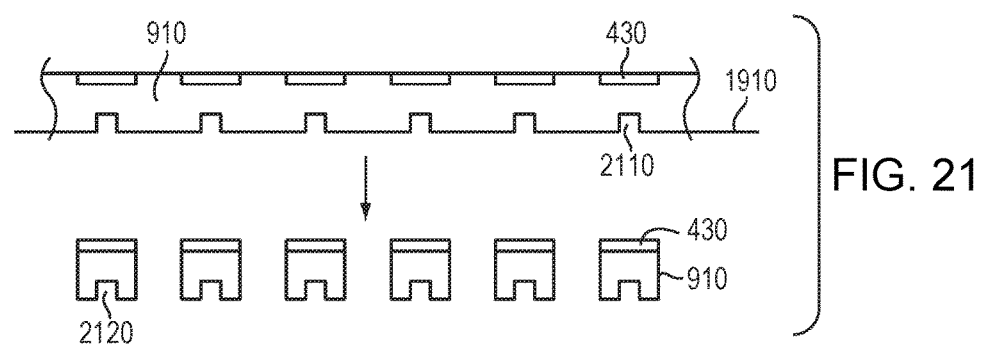

In one embodiment, the surface 1910 includes one or more protrusions and/or one or more indentations which are then replicated (in negative, complementary form) in the transparent material 910. FIG. 21 shows one embodiment in which surface 1910 has multiple protrusions 2110 that form a void region or well 2120 in transparent material 910 that fits over one or more LEEs upon alignment with the LEE(s).

Figure 22:
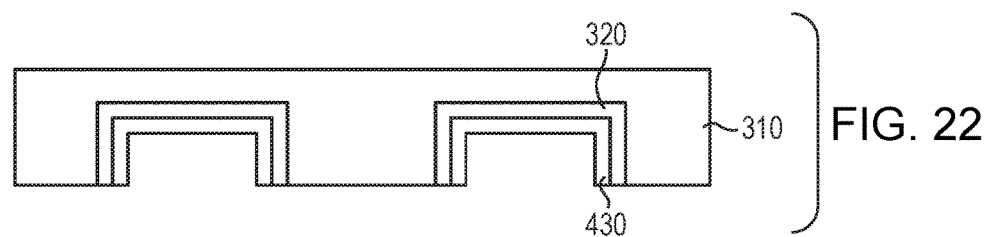
FIGS. 22-25 are cross-sectional schematics of illustrating steps of fabrication processes for phosphor arrangements in accordance with various embodiments of the present invention.
Figure 23:
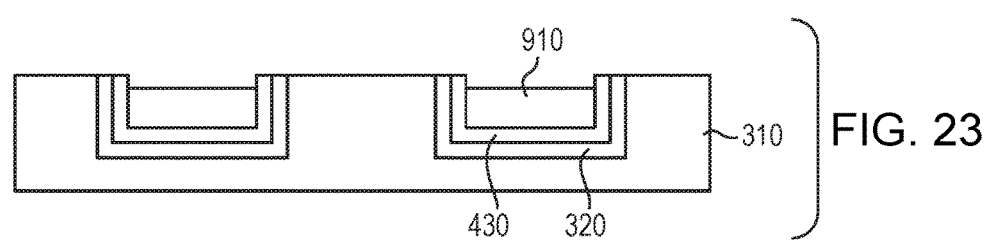
Figure 24:
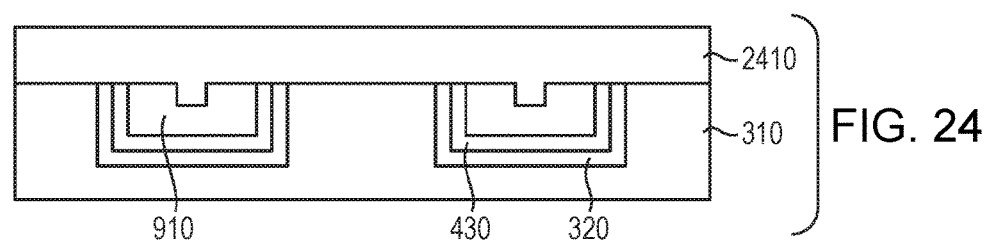
Figure 25:
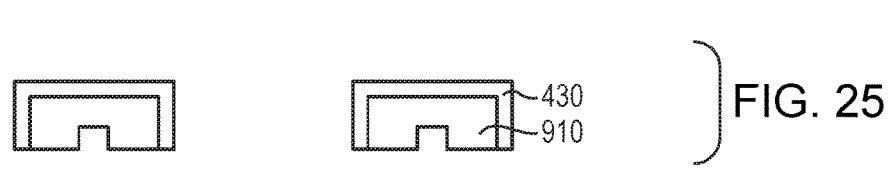

Another exemplary embodiment is shown in FIG. 25. The formation of the structure of FIG. 25 starts with insulating substrate 310 and conductive regions 320 as shown in FIG. 22, where the conductive regions 320 are formed in and conform to the sidewalls of wells (i.e., a type of concave structure that may have substantially straight sidewalls) in substrate 310. As shown, powder 430 is then attached to conductive regions 320. Next, transparent material 910 is formed into the wells of powder 430, as shown in FIG. 23 (insulating substrate 310 shown turned over in FIG. 23, but this is not a limitation of the present invention). In the next step, as shown in FIG. 24, a mold 2410 is mated with insulating substrate 310, where the mold 2410 has one or more protrusions that substantially align with the wells of conductive material 320. Transparent material 910 is then cured and removed from mold 2410 and the wells in conductive material 320, leaving the structure shown in FIG. 25. In one embodiment each indentation in the structure in FIG. 25 is placed over one or more LEEs.

In general herein, powder 430 is shown as disposed on top of transparent material 910; however, in other embodiments powder 430 is infused completely or partially into transparent material 910. In one embodiment powder 430 is formed as a layer at the edge of transparent material 910, but it may also be substantially or completely encased by transparent material 910. The extent to which powder 430 sits on the surface or is absorbed by or covered by transparent material 910 may be controlled by controlling the formation conditions and material properties, for example particle size and density, viscosity, and processing temperature of transparent material 910. In some embodiments, transparent material 910 is hardened by curing, for example by thermal or light-based curing. In one embodiment, the extent to which powder 430 extends into and/or is covered by transparent material 910 is controlled by the viscosity and processing temperature. Lower viscosity will generally result in increased extension into and/or coverage, while higher viscosity will generally result in decreased extension into and/or coverage. Extension into and coverage of powder 430 by transparent material 910 may also be controlled by performing a partial or complete cure at some time after powder transfer, that time being determined by the desired extent of extension into and/or coverage of powder 430 by transparent material 910. In one embodiment the powder 430 composition may be graded to achieve a desired powder 430 composition profile within transparent material 910. For example, in one embodiment the powder 430 composition may be graded to monotonically increase in the direction away from LEE 1120. However this is not a limitation of the present invention and in other embodiments the powder 430 composition may be monotonically graded in the opposite direction, or may be graded in a non-monotonic profile, or may have any arbitrary profile. In some embodiments powder 430 may include or consist essentially of multiple different powders each havaing a different profile.

In one embodiment, the pattern of conductive regions 320 (for example as shown in FIG. 7) represents the desired distribution of phosphor powder. In one embodiment, the pattern of conductive regions 320 represents conductive addressable "pixels" that may be selectively activated and de-activated, to permit production of different patterns of powder 430 using the same system.

The embodiments discussed above show the insulating substrate 310 (e.g., in FIG. 3) as being substantially flat; however, this is not a limitation of the present invention and in other embodiments insulating substrate 310 is curved or has any arbitrary shape. In some embodiments, the conductive substrate 310 is formed into a cylinder or drum to permit continuous or roll-to-roll processing, for example in a mode that is similar to a printing press, photocopier, or laser printer.

In various embodiments discussed above, the phosphor powder is attracted or attached to regions that have been activated. In other embodiments, the phosphor powder is attracted to substrate 300, and regions 320 are activated to form regions not attractive to the phosphor powder.

In one embodiment, the processes shown in FIGS. 1 and 2 are performed using a photoconductive surface instead of the conductive regions 320 shown in FIG. 3. The photoconductive surface is light-sensitive (and may also be called a photoreceptor) and typically includes or consists essentially of a thin layer of photoconductive material. In some embodiments, the photoconductive material is applied to a flexible belt or drum.

Figure 26:
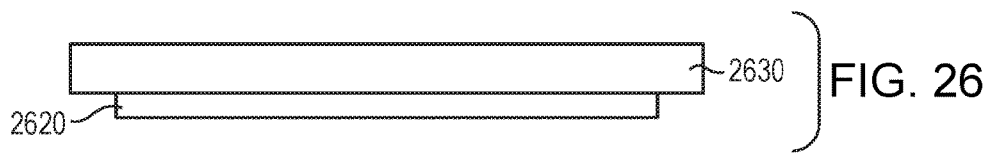
FIGS. 26, 27A, 27B, 28, and 29 are cross-sectional schematics of illustrating steps of fabrication processes for phosphor arrangements in accordance with various embodiments of the present invention.

The photoconductive surface may be selectively charged by exposure to light, and the selectively charged regions may attract the powder for subsequent deposition, as shown in FIG. 26. Per step 210 of FIG. 1, a photoconductive surface 2620 is provided. In one embodiment, the photoconductive surface 2620 is unsupported (i.e., free-standing), while in another embodiment photoconductive surface 2620 is formed on a support structure 2630, as shown in FIG. 26.

Figure 27A:
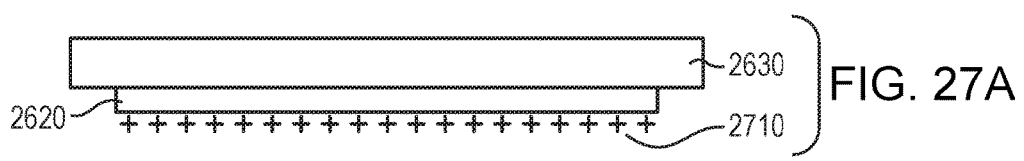
Figure 27B:
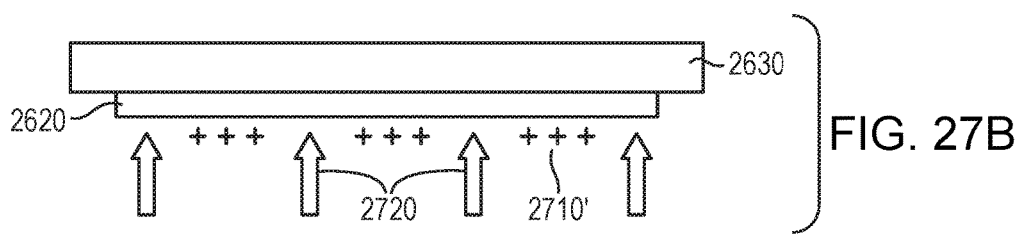

Activation of the photoconductive surface 2620 occurs next, per step 220 of FIG. 2. In one embodiment, activation is a two-part process, as shown in FIGS. 27A and 27B. The photoconductive surface 2620 is typically insulating when not illuminated but becomes conducting upon exposure to light. Surface 2620 is first charged without illumination, for example, by applying a high DC voltage to wires adjacent to photoconductive surface 2620. The voltage produces an electric field near the wires that causes the air molecules to ionize. Ions of the same polarity as the voltage on the wires deposit on photoconductive surface 2620, creating an electric field across surface 2620 and resulting in a uniform or substantially uniform charge 2710 over photoconductive surface 2620, as shown in FIG. 27A. While FIG. 27A shows photoconductive surface 2620 having a positive charge, in other embodiments photoconductive surface 2620 has a negative charge.

Next, one or more portions of the photoconductive surface 2620 are exposed to light 2720 that discharges the illuminated regions thereof, causing a localized reduction in the electric field, as shown in FIG. 27B. The unilluminated (or dark) areas retain their charge 2710'. By selectively illuminating charged photoconductive surface 2620, a charge image may be formed thereon. The image represented by the charged portions will attract the powder in subsequent steps. In one embodiment, photoconductive surface 2620 is exposed or illuminated by one or more scanning modulated lasers or an LED image bar. In one embodiment illumination occurs from light reflected from an illuminated image.

Figure 28:
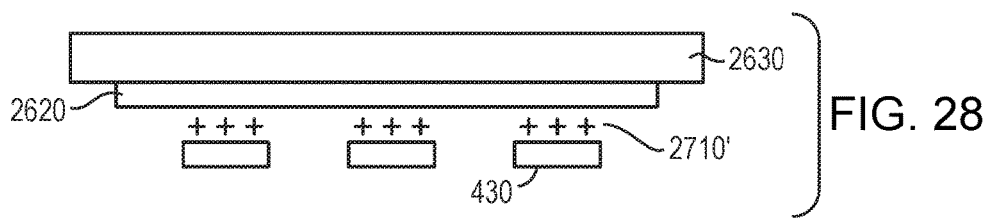

In step 230 (FIG. 2), powder 430 is attached to the activated portions of photoconductive surface 2620, as shown in FIG. 28. In one embodiment powder 430 is charged with a polarity opposite that on photoconductive surface 2620. In one embodiment, powder 430 is charged via the phenomenon of triboelectricity (i.e., static electricity). In some embodiments, powder 430 is mixed with and optionally charged by magnetized carrier beads that may be used to transport powder 430 to different zones in a manufacturing tool. The electric field associated with the charge pattern of the image on photoconductive surface 2620 exerts an electrostatic force on charged powder 430, which then adheres to the charge pattern on photoconductive surface 2620. The powder may be supplied to the structure shown in FIG. 28 in a variety of ways; one embodiment is shown in FIG. 4B. In other embodiments, powder 430 is poured over photoconductive surface 2620. In some embodiments, powder 430 is applied by rolling a photoconductive surface 2620 in the form of a drum or reel through or over powder 430.

Figure 29:
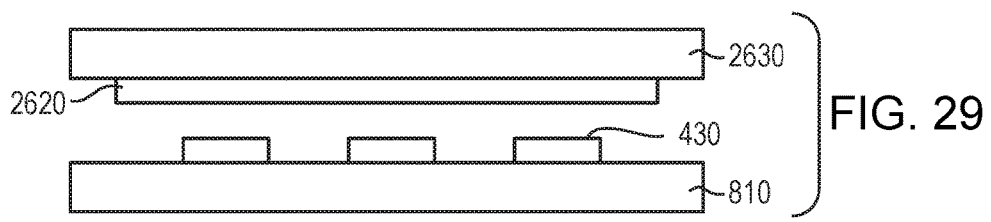

In step 250 (FIG. 2), powder 430 is transferred from photoconductive surface 2620 to target 810, as shown in FIG. 29. In one embodiment, the transfer is performed by bringing target 810 into contact with powder 430 and then applying a charge with a polarity opposite to that of powder 430. The charge is generally strong enough to overcome the powder adhesion to photoconductive surface 2620. Target 810 is then released with a second controlled charge. At this point in the process, powder 430 has been transferred from photoconductive surface 2620 to target 810, as shown in FIG. 29.

In one embodiment, the process described in conjunction with FIGS. 26-29 is performed with dry powder. In one embodiment, the process described in conjunction with FIGS. 26-29 is performed using equipment similar to a photocopier or a laser printer. In one embodiment, the processes described with respect to powder transfer may include a further step of cleaning the powder off of support 2630 and/or photoconductive surface 2620. In one embodiment, such cleaning is performed using a rotating brush. The cleaning may even be performed by blowing the powder off of the drum.

In some embodiments, powder 430 includes or consists essentially of a light-conversion material, for example a phosphor (with or without an accompanying polymer). In some embodiments, powder 430 comprises one or more phosphor powders and one or more polymer powders or particles. In one embodiment, after transfer of powder 430 to target 810, powder 430 is heated to melt or partially melt the polymer, which acts to fix the phosphor powder in place. In some embodiments, the polymer is substantially transparent to a wavelength of light emitted by LEEs 1120 and/or powder 430.

Figure 30:
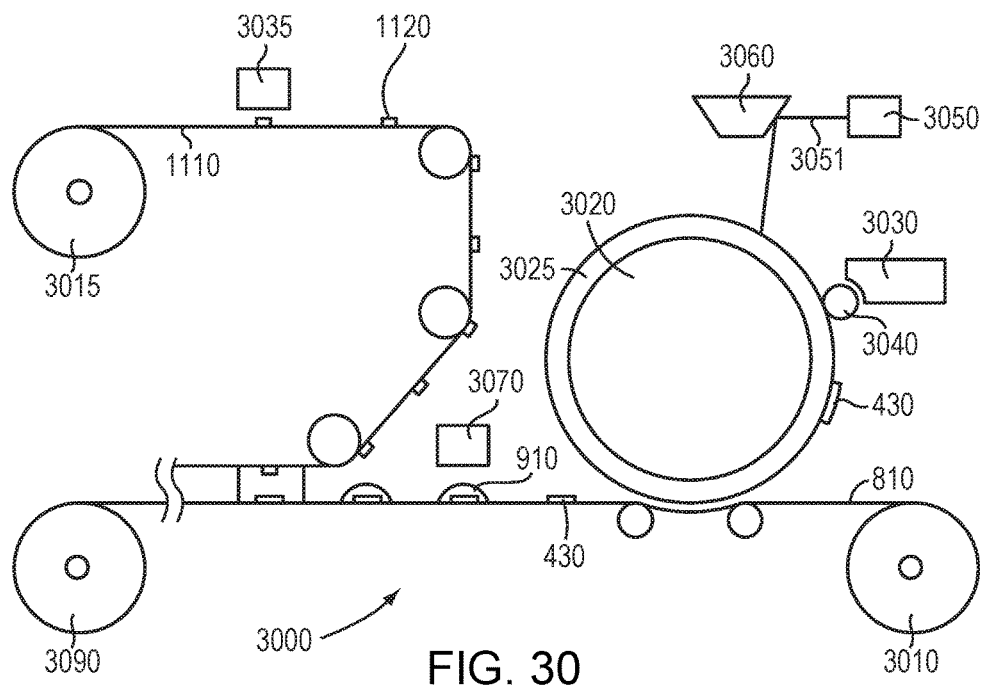
FIGS. 30 and 31 are cross-sectional schematics of reel-to-reel systems for fabrication of phosphor arrangements and integration of phosphor arrangements with light-emitting elements in accordance with various embodiments of the present invention.

FIG. 30 shows one embodiment of the present invention incorporating a roll-to-roll process. System 3000 includes or consists essentially of target 810, a supply roll 3010 for target 810, substrate 1110, a supply roll 3015 for substrate 1110, LEEs 1120 formed over substrate 1110 using a die-attach tool 3035, a dispenser 3070 to dispense binder 910 over powder 430, a photoconductive surface 3025 over drum 3020, an illuminator 3050, and a scanning system 3060 to permit scanning of light 3051 from illuminator 3050 onto photoconductive surface 3025. Light 3051 from illuminator 3050 is scanned onto photoconductive surface 3025 to generate an electrostatic image on photoconductive surface 3025, which attracts powder 430, leaving powder 430 selectively attached to photoconductive surface 3025. The selectively attached powder 430 on photoconductive surface 3025 is then transferred to target 810. Binder 910 is dispensed over powder 430 prior to mating with substrate 1110 and LEEs 1120, forming the lightsheet identified as 1200 in FIG. 12. The lightsheet 1200 is then taken up on a final roll 3090. Powder 430 is stored in a container 3030 and attached to photoconductive surface 3025 through a roller 3040. Illuminator 3050 may include or consist essentially of one or more lasers or one or more LEDs. In some embodiments, binder 910 is formed over LEEs 1120 before mating with powder 430 and target 810. In some embodiments, LEEs 1120 are attached to substrate 1110 prior to this process—in this case supply roll 3015 dispenses substrate 1110 over which LEE 1120 have been formed.

Figure 31:
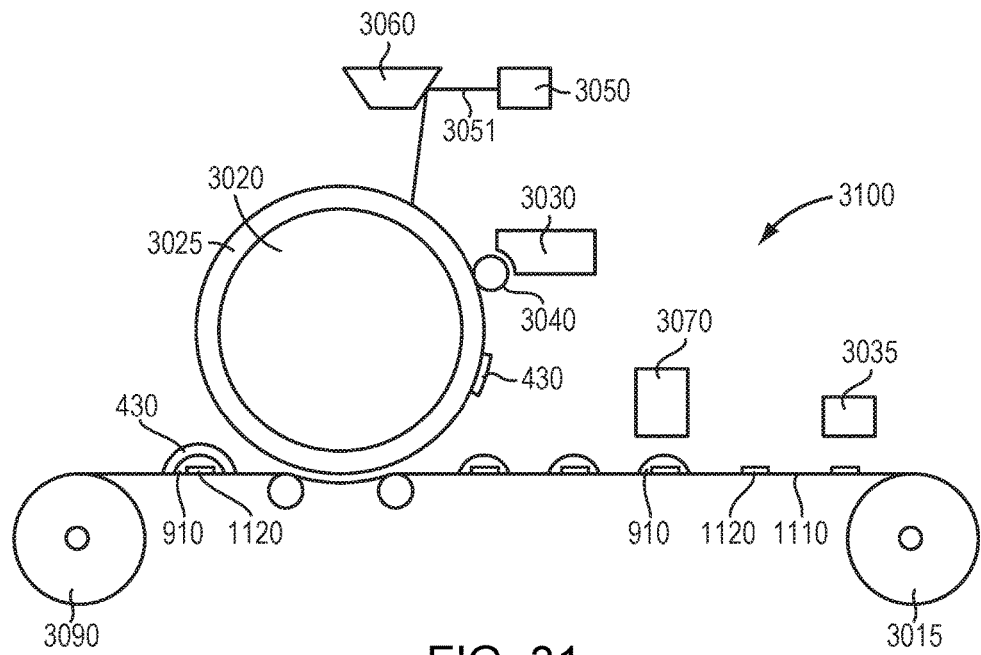

FIG. 31 shows another embodiment of the present invention incorporating a roll-to-roll process. System 3100 includes or consists essentially of substrate 1110 and supply roll 3015 for substrate 1110, LEEs 1120 formed over substrate 1110 using die-attach tool 3035, dispenser 3070 to dispense binder 910 over LEEs 1120, photoconductive surface 3025 over drum 3020, illuminator 3050, and scanning system 3060 to permit scanning of light 3051 from illuminator 3050 onto photoconductive surface 3025. Light 3051 from illuminator 3050 scanned onto photoconductive surface 3025 generates an electrostatic image on photoconductive surface 3025, which attracts powder 430, leaving powder 430 selectively attached to photoconductive surface

3025. Powder 430 is then transferred from photoconductive surface 3025 to binder 910, forming the lightsheet shown in FIG. 17. The lightsheet is then taken up on final roll 3090.

FIGS. 30 and 31 show two embodiments; other embodiments have additional or fewer steps or components or may be carried out in a different order. All or some of the components shown in FIGS. 30 and 31 may be similar to those used in laser printers, LED printers, photocopiers, or the like. In some embodiments, powder 430 is transferred to target 810 using one or more conductive regions 320 formed on an insulating substrate 310 in the form of a drum or reel. Binder 910 may be cured during the processes illustrated in FIGS. 30 and 31, and/or conductive traces may be formed on substrate 1110 prior to formation or placement of LEEs 1120 over substrate 1110.

In general, in the above discussion the arrays of light emitters, wells, optics and the like have been shown as square or rectangular arrays; however, this is not a limitation of the present invention and in other embodiments these elements are formed in other types of arrays, for example hexagonal, triangular, or any arbitrary array. In some embodiments these elements are grouped into different types of arrays on a single substrate.

The terms and expressions employed herein are used as terms and expressions of description and not of limitation, and there is no intention, in the use of such terms and expressions, of excluding any equivalents of the features shown and described or portions thereof. In addition, having described certain embodiments of the invention, it will be apparent to those of ordinary skill in the art that other embodiments incorporating the concepts disclosed herein may be used without departing from the spirit and scope of the invention. Accordingly, the described embodiments are to be considered in all respects as only illustrative and not restrictive.

What is claimed is:

1. A method of forming an arrangement of phosphors, the method comprising:
   activating one or more regions of a first substrate whereby the one or more regions electrostatically attract phosphor powder;
   introducing phosphor powder to the first substrate, the phosphor powder adhering to the one or more activated regions of the first substrate but not to other exposed regions of the first substrate;
   disposing the first substrate proximate to a second substrate;
   transferring the adhered phosphor powder to the second substrate, thereby forming the arrangement of phosphors; and
   removing the first substrate.

2. The method of claim 1, wherein disposing the first substrate proximate to the second substrate comprises disposing the first substrate in at least partial contact with the second substrate.

3. The method of claim 1, wherein the one or more regions of the first substrate are each a portion of a photoconductive surface, and activating the one or more regions comprises (i) inducing an electrical charge on the entire photoconductive surface and (ii) illuminating portions of the photoconductive surface other than the one or more regions to diminish the charge on the illuminated portions.

4. The method of claim 1, wherein activating the one or more regions comprises inducing an electrical charge thereon.

5. The method of claim 4, wherein the one or more regions of the first substrate are conductive regions in or on the first substrate.

6. The method of claim 4, further comprising inducing an opposite electrical charge on the phosphor powder prior to adhering the phosphor powder to the one or more activated regions, the opposite electrical charge having a polarity opposite that of the electrical charge on the one or more regions.

7. The method of claim 4, wherein transferring the adhered phosphor powder to the second substrate comprises inducing an electrical charge on the second substrate.

8. The method of claim 4, wherein transferring the adhered phosphor powder comprises at least partially removing the electrical charge from the one or more regions of the first substrate.

9. The method of claim 1, wherein (i) the one or more activated regions of the first substrate are indented, and (ii) the adhered phosphor powder is transferred to one or more complementary structures on the second substrate.

10. The method of claim 9, wherein each of the complementary structures comprises one or more light-emitting elements therein.

11. The method of claim 1, wherein the phosphor powder comprises phosphor particles and a binder.

12. The method of claim 11, further comprising heating the binder to fix the phosphor powder in place after transfer to the second substrate.

13. The method of claim 1, further comprising, after the first substrate is removed, associating one or more light-emitting elements with each phosphor such that each phosphor of the arrangement of phosphors is positioned to receive light from at least one light-emitting element.

14. The method of claim 13, further comprising disposing a transparent material over at least one of the phosphors before associating the one or more light-emitting elements with each phosphor.

15. The method of claim 14, wherein the transparent material comprises at least one of silicone or epoxy.

16. The method of claim 13, wherein associating the one or more light-emitting elements with each phosphor comprises bonding to the second substrate a third substrate having the one or more light-emitting elements thereon, whereby each phosphor is aligned with one or more light-emitting elements.

17. The method of claim 16, wherein (i) the adhered phosphor powder is transferred to indented regions in the second substrate, and (ii) associating the one or more light-emitting elements with each phosphor comprises disposing one or more light-emitting elements in each indented region.

18. The method of claim 16, wherein the second substrate comprises a first surface adjacent to the phosphors and a second surface, opposite the first surface, comprising a plurality of optical elements, at least one optical element being positioned to receive light from at least one phosphor.

19. The method of claim 18, wherein each optical element is positioned to receive light from a different light-emitting element.

20. The method of claim 16, wherein at least one of the second or third substrates comprises at least one of acrylic, polycarbonate, polyethylene naphthalate, polyethylene terephthalate, polycarbonate, polyethersulfone, polyester, polyimide, polyethylene, glass, or teflon.

21. The method of claim 16, wherein at least one of the second or third substrates is flexible.

22. The method of claim 16, wherein the light-emitting elements are electrically interconnected on the third substrate.

23. The method of claim 13, wherein each phosphor is associated with a different light-emitting element.

24. The method of claim 13, wherein each light-emitting element comprises a light-emitting diode.

25. The method of claim 13, wherein each light-emitting element is a bare-die light-emitting diode.

26. The method of claim 1, wherein the activating, introducing, and transferring steps are each performed as part of a roll-to-roll process.

* * * * *